(12) United States Patent
Li et al.

(10) Patent No.: US 12,495,497 B2
(45) Date of Patent: Dec. 9, 2025

(54) LOW POWER MEMORY MODULE

(71) Applicant: Intel Corporation, Santa Clara, CA (US)

(72) Inventors: Xiang Li, Portland, OR (US); Konika Ganguly, Portland, OR (US); George Vergis, Portland, OR (US); Stephen Christianson, Tigard, OR (US); Xiaopeng Dong, Hillsboro, OR (US); Landon Hanks, Milwaukie, OR (US)

(73) Assignee: Intel Corporation, Santa Clara, CA (US)

( * ) Notice: Subject to any disclaimer, the term of this patent is extended or adjusted under 35 U.S.C. 154(b) by 673 days.

(21) Appl. No.: 17/700,972

(22) Filed: Mar. 22, 2022

(65) Prior Publication Data

US 2022/0217846 A1    Jul. 7, 2022

(51) Int. Cl.
*H05K 1/14* (2006.01)
*H05K 1/11* (2006.01)
*H05K 1/18* (2006.01)

(52) U.S. Cl.
CPC ............. *H05K 1/141* (2013.01); *H05K 1/111* (2013.01); *H05K 1/117* (2013.01); *H05K 1/181* (2013.01); *H05K 2201/10159* (2013.01)

(58) Field of Classification Search
CPC ..................................... H05K 1/141
USPC ......................................... 361/767
See application file for complete search history.

(56) References Cited

U.S. PATENT DOCUMENTS

| | | | |
|---|---|---|---|
| 11,108,374 B1* | 8/2021 | Lower | H03H 9/70 |
| 2012/0305751 A1* | 12/2012 | Kusuda | H04N 25/63 |
| | | | 250/208.1 |
| 2013/0127041 A1* | 5/2013 | Goh | H01L 24/97 |
| | | | 257/737 |
| 2016/0111391 A1* | 4/2016 | Paek | H01L 23/49827 |
| | | | 361/767 |
| 2020/0260570 A1* | 8/2020 | Chujo | H05K 1/0245 |
| 2023/0074430 A1* | 3/2023 | Lee | H01L 24/97 |

* cited by examiner

*Primary Examiner* — Stanley Tso
(74) *Attorney, Agent, or Firm* — Essential Patents Group, LLP

(57) ABSTRACT

An embodiment of an electronic apparatus comprises a circuit board, one or more memory devices affixed to a top side of the circuit board, and one or more board-to-board connectors affixed to a bottom side of the circuit board to provide an external connection to signals of the one or more memory devices, where the one or more board-to-board connectors are located inward from outermost edges of the circuit board and where a first footprint defined by an outermost boundary of the one or more board-to-board connectors is substantially a same size as or smaller than a second footprint defined by an outermost boundary of the one or more memory devices. Other embodiments are disclosed and claimed.

18 Claims, 5 Drawing Sheets

LOW POWER MEMORY MODULE

BACKGROUND

A ball grid array (BGA) is a type of surface mount technology used for integrated circuit (IC) packages. A surface-mount package with a BGA becomes permanently attached to the mounting surface, such as a motherboard or other circuit board substrate. BGA packages may provide more connections than other types of packages because the entire bottom surface of the device may be used for pins. BGA technology may also be well-suited for high speeds because the trace length from the package leads to the wires or balls that connect the die to package may be shorter. Plastic ball grid array (PBGA) is another packaging alternative for high I/O devices with high lead count.

BGA packaging can be used for high-performance applications with high thermal and electrical requirements. BGAs fit ICs into a smaller footprint, decreasing pitch spacing, by utilizing an array of solder ball connections. This allows for a higher density of I/O connections than that of other packages. The result is a considerably smaller finished package size. These characteristics make the BGA package suitable for a wide variety of devices such as microprocessors/microcontrollers, application-specific ICs (ASICs), memory, computer chip sets, and other products. A thin profile and smaller footprint make the BGA an attractive option when board space is a concern. Small body size BGA packages come close to chip scale package size for use in space constrained applications.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
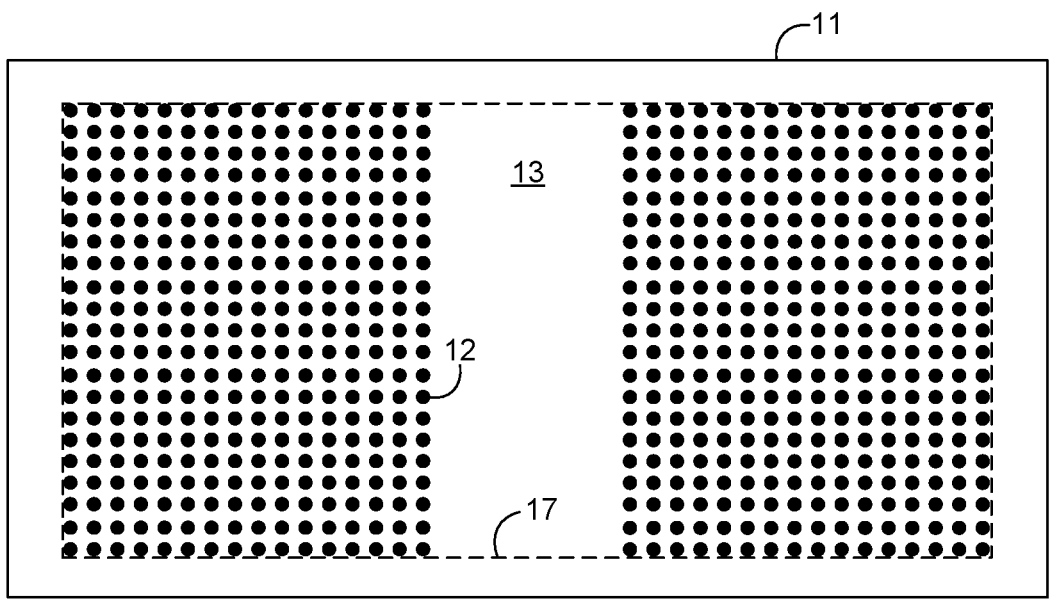
FIGS. 1A and 1B are respective top and bottom view block diagrams of an example of a circuit board according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, JESD209-4 for LPDDR4, and JESD79-5 for DDR5 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, JESD230, or other suitable standard (the JEDEC standards cited herein are available at jedec.org).

Some embodiments may provide technology for a removable high lead count device module. High lead count devices may be utilized on various electronic systems. Typically, high lead count devices are mounted in a ball grid array (BGA) package that is soldered directly on the main board (e.g., the motherboard). A problem is that the directly soldered high lead count components provide less flexibility for upgrade and/or lack of scalability. Some embodiments advantageously overcome one or more of the foregoing problems.

Figure 1B:
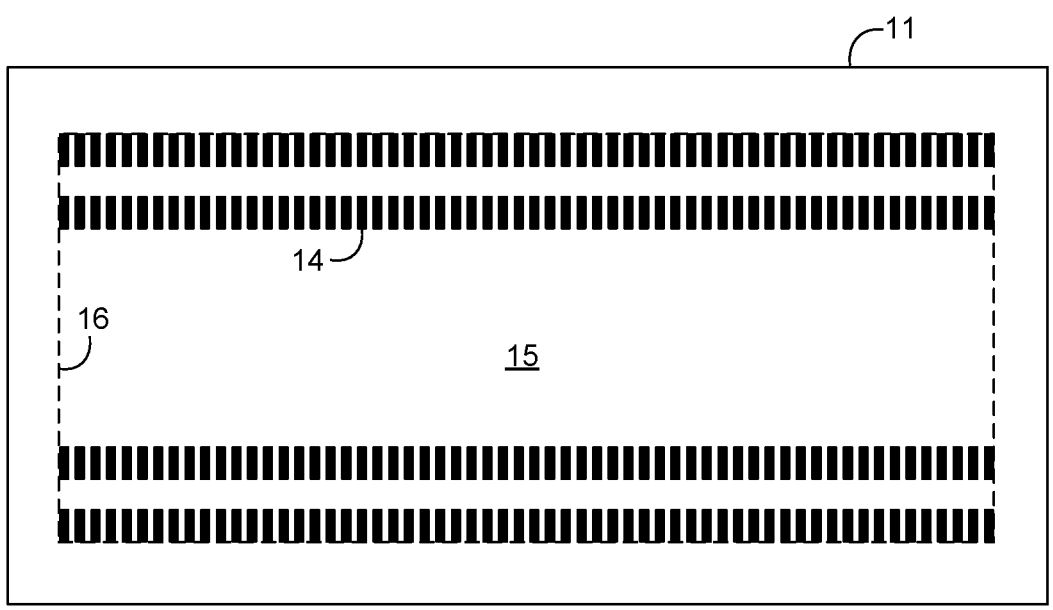
Figure 2A:
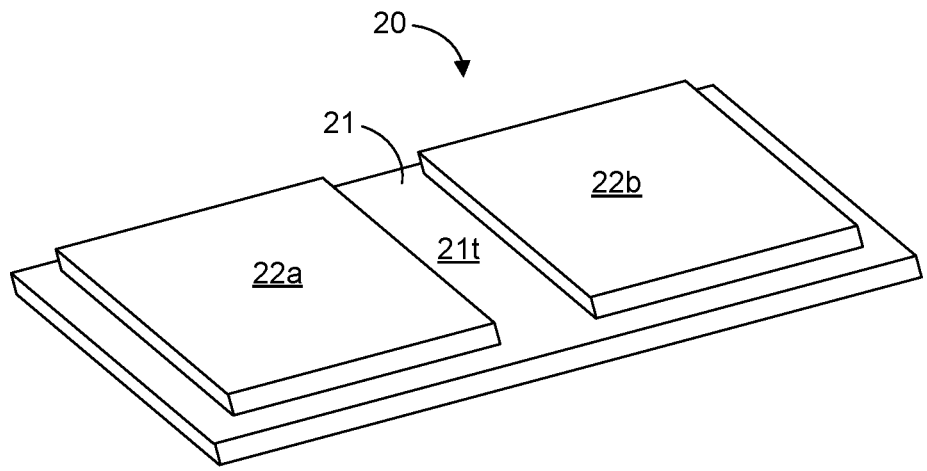
FIGS. 2A to 2D are respective top perspective, bottom perspective, top and bottom views of an example of an electronic apparatus according to an embodiment.
Figure 2B:
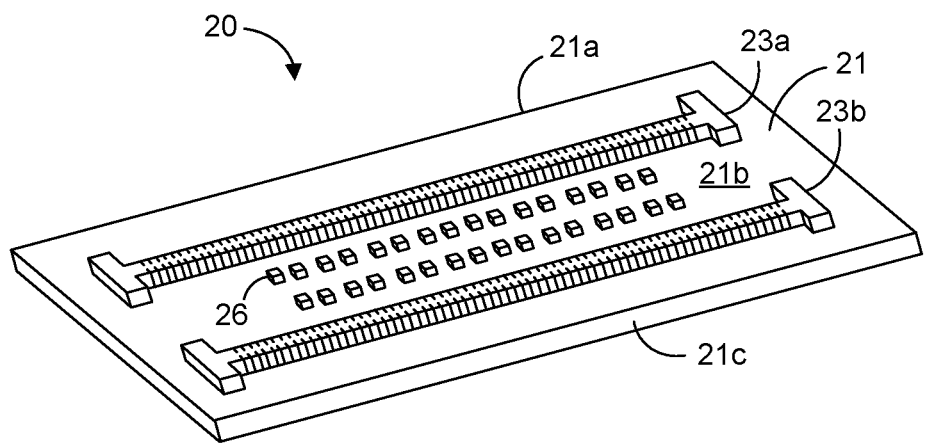
Figure 2C:
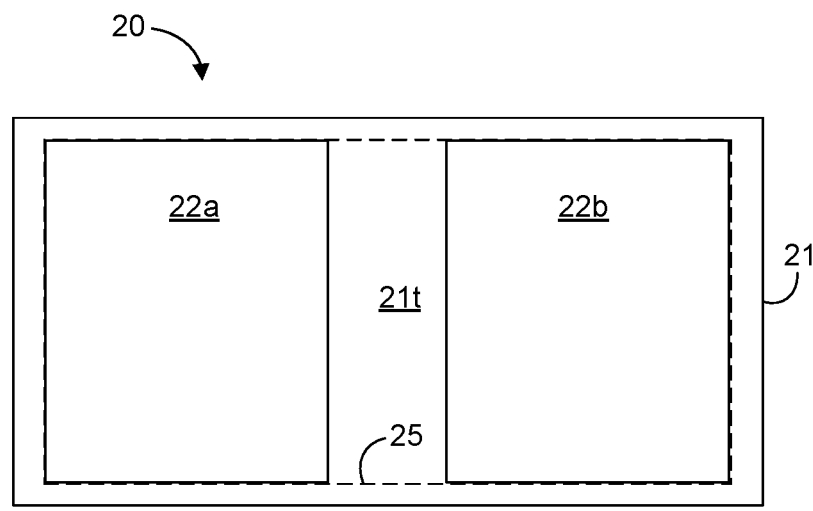
Figure 2D:
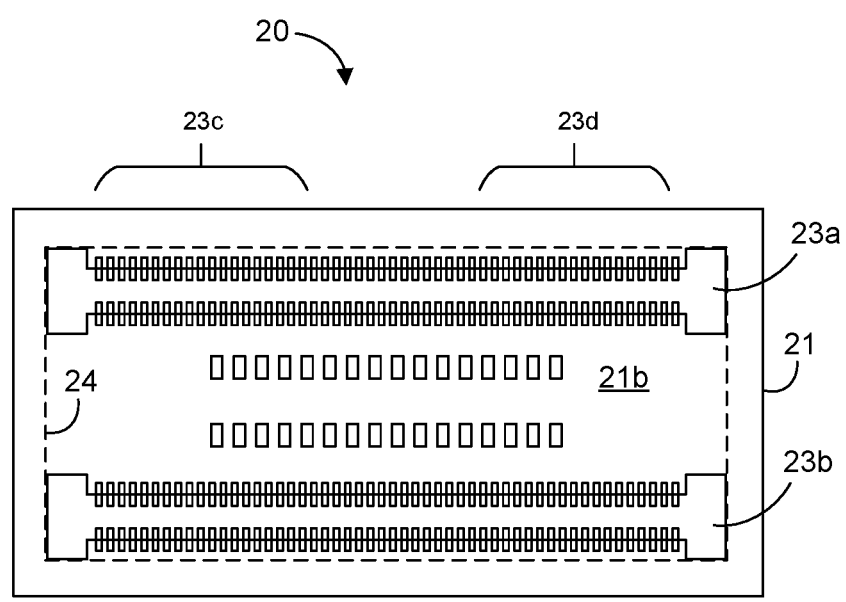

With reference to FIGS. 1A to 1B, an embodiment of a circuit board 11 includes signal pads 12 on a top side 13 of the circuit board 11 and pins pads 14 on a bottom side 15 of the circuit board 11. For example, the signal pads 12 may be configured to affix one or more BGA package(s) thereto and the pin pads 14 may be configured to affix one or more surface mount connector(s) thereto. For implementations of the embodiments described herein, any suitable package technology and any suitable connector technology may be utilized. The figures are illustrative only and not necessarily to scale. The particular number, arrangement, and size of the pads are likewise illustrative only. Implementations may include more or fewer pads, different pad arrangements, and different pad sizes, as may be suitable for particular device packages and/or connectors.

As shown in FIGS. 1A and 1B, the signal pads 12 and pin pads 14 are located inward from outermost edges of the circuit board 11, and a pin pad footprint 16 defined by an outermost boundary of the pin pads 14 is substantially a same size as or smaller than a signal pad footprint 17 defined by an outermost boundary of the signal pads 12. Advantageously, embodiments of a removable module that utilizes the circuit board 11 may keep a similar footprint as a typical solder down area on a main board for the BGA package(s), but provides system flexibility for upgrade and scaling. In some embodiments, the surface mount connector(s) may be board-to-board connectors. Advantageously, board-to-board connectors may keep a low height of the removable module with respect to the main board (e.g., as compared to other types of connectors such as header connectors, edge connectors, etc.).

In some embodiments, the signal pads 12 are electronically coupled to the pin pads 14 internal to the circuit board 11 to provide closer proximity of signal and pin pad pairs for data signals of the BGA package(s) relative to non-data signals of the BGA package(s). For example, particular pins of the affixed connector(s) may be assigned to particular data signals such that respective routing lengths between respective signals pads 12 of the BGA package(s) and pin pads 14 of the connector(s) for a majority of the data signals are less than 3 millimeters (e.g., less than about 0.1 inches). In some embodiments, signal pads for the data signals of the BGA package(s) are substantially all coupled to pin pads of the connector(s) that are located within respective areas of the circuit board 11 defined by outermost boundaries of the signal pads for each of the BGA package(s) (e.g., within the BGA package area).

With reference to FIGS. 2A to 2D, an embodiment of an electronic apparatus 20 may include a circuit board 21, one or more memory devices 22a, 22b (collectively memory devices 22) affixed to a top side 21t of the circuit board 21, and one or more board-to-board connectors 23a, 23b (collectively connectors 23) affixed to a bottom side 21b of the circuit board 21 to provide an external connection to signals of the one or more memory devices 22. In some embodiments, the one or more board-to-board connectors 23 are located inward from outermost edges of the circuit board 21 and a first footprint 24 defined by an outermost boundary of the one or more board-to-board connectors 23 is substantially a same size as or smaller than a second footprint 25 defined by an outermost boundary of the one or more memory devices 22. For example, the one or more board-to-board connectors 23 may comprise plug-style connectors to mate with receptacle-style connectors on another circuit board (e.g., a main board, a motherboard, etc.). For example, the one or more memory devices 22 may comprise low power memory devices. Advantageously, embodiments of the apparatus 20 may keep a similar footprint as a typical solder down area on a main board for the memory devices 22, but provides system flexibility for upgrade and scaling. In some embodiments, utilizing the board-to-board connectors 23 on the bottom side 21b of the circuit board 21 may keep a low height of the apparatus 20 with respect to the main board.

In some embodiments, the one or more board-to-board connectors 23 may comprise the first board-to-board connector 23a located proximate to a first edge 21a of the circuit board 21, and a second board-to-board connector 23b located proximate to a second edge 21c of the circuit board 21 opposite to the first edge 21a. The apparatus 20 may further include one or more electronic components 26 affixed to the bottom side 21b of the circuit board 23 in between the first board-to-board connector 23a and the second board-to-board connector 23b. For example, the one or more electronic components 26 may comprise discrete components (e.g., such as surface mount capacitors).

In some embodiments, signal pads of the one or memory devices 22 are electronically coupled to pin pads of the one or more board-to-board connectors 23 to provide closer proximity of signal pads and pin pads for data signals of the one or more memory devices 22 relative to non-data signals of the one or more memory devices 22. For example, respective routing lengths between signals pads of the one or memory devices 22 and pin pads of the one or more board-to-board connectors 23 for a majority of the data signals may be less than 3 millimeters. In some embodiments, signal pads for the data signals of the one or more memory devices 22 are substantially all coupled to pin pads of the one or more board-to-board connectors 23 that are located within respective areas of the circuit board 21 defined by an outermost boundary of the signal pads of each of the one or more memory devices 22 (e.g., within a bailout area of each memory device). In some embodiments, signal pads for lower order bits of the data signals of the one or more memory devices 22 are coupled to pin pads at a first end 23*c* of the one or more board-to-board connectors 23 and signal pads for upper order bits of the data signals of the one or more memory devices 22 are coupled to pin pads at a second end 23*d* of the one or more board-to-board connectors 23 opposite to the first end 23*c*.

Figure 3:
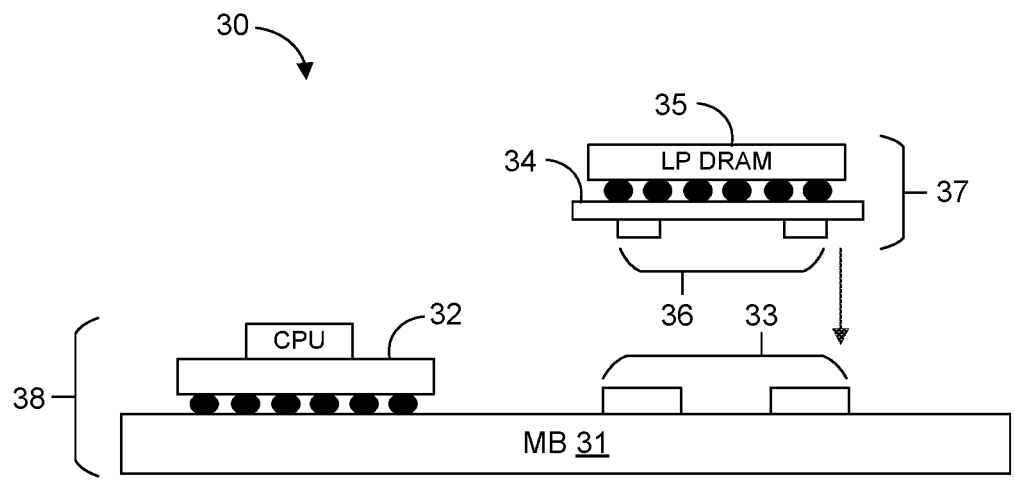
FIG. 3 is a front, partially exploded view block diagram of an example of an electronic system according to an embodiment.

With reference to FIG. 3, an embodiment of an electronic system 30 may include a main board 31 with one or more electronic components 32 (e.g., including a central processor unit (CPU)) affixed thereto and a first set of one or more board-to-board connectors 33 affixed thereto, and a memory board 34 with one or more memory devices 35 (e.g., low power memory devices) affixed to a top side of the memory board 34 and a second set of one or more board-to-board connectors 36 affixed to a bottom side of the memory board 34 and located inward from outermost edges of the memory board 34. The second set of one or more board-to-board connectors 36 may be mechanically and electrically coupled to the first set of one or more board-to-board connectors 33 on the main board 31. As shown in FIG. 3, the memory board 34, memory devices 35, and second set of board-to-board connectors 36 provide a removable memory module 37 that may be plugged into a main assembly 38 (e.g., that includes the main board 31, the components 32, and the first set of board-to-board connectors 33), where the first set of one or more board-to-board connectors 33 comprise receptacle-style connectors and the second set of one or more board-to-board connectors 36 comprise plug-style connectors. The system 30 may further include one or more additional sets of one or more board-to-board connectors affixed to the main board to couple to additional memory modules (not shown).

In some embodiments, a first footprint defined by an outermost boundary of the second set of one or more board-to-board connectors 36 is substantially a same size as or smaller than a second footprint defined by an outermost boundary of the one or more memory devices 35. For example, the second set of one or more board-to-board connectors 36 may comprise a first board-to-board connector located proximate to a first edge of the memory board 34, and a second board-to-board connector located proximate to a second edge of the memory board 34 opposite to the first edge. The system 30 may also include one or more electronic components (e.g., discrete components; not shown) affixed to the bottom side of the memory board 34 in between the first board-to-board connector and the second board-to-board connector.

In some embodiments, signal pads of the one or memory devices 35 are electronically coupled to pin pads of the second set of one or more board-to-board connectors 36 to provide closer proximity of signal pads and pin pads for data signals of the one or more memory devices 35 relative to non-data signals of the one or more memory devices 35. For example, respective routing lengths between signals pads of the one or memory devices 35 and pin pads of the second set of one or more board-to-board connectors 36 for a majority of the data signals may be less than 3 millimeters. In some embodiments, signal pads for the data signals of the one or more memory devices 35 are substantially all coupled to pin pads of the second set of one or more board-to-board connectors 36 that are located within respective areas of the memory board 34 defined by an outermost boundary of the signal pads of each the one or more memory devices 35, and/or signal pads for lower order bits of the data signals of the one or more memory devices 35 may be coupled to pin pads at a first end of the second set of one or more board-to-board connectors 36 and signal pads for upper order bits of the data signals of the one or more memory devices 35 may be coupled to pin pads at a second end of the second set of one or more board-to-board connectors 36 opposite to the first end.

Some embodiments may provide technology for a novel form factor memory module. Low power memory, such as LP DDR5 (LP5), may be utilized on various electronic systems for low power consumption to extend battery life and better performance. Typically, LP5 components are soldered directly on the main board (e.g., the motherboard). A problem is that the directly soldered LP5 components provide less flexibility for upgrade and/or lack of scalability. Some embodiments advantageously overcome one or more of the foregoing problems.

Some embodiments provide a separate low power memory module that may be removably coupled a main board. In some embodiments, a LP5 memory module may have a novel form factor. For example, two board-to-board plug connectors may be placed side by side at the bottom side of the memory module, with the LP5 component(s) placed on the top of the module. Mating receptacle connectors may be installed on the main board (e.g., a motherboard in some electronic systems). Advantageously, embodiments of a memory module form factor may keep a same footprint as a typical memory solder down area on a main board, but provides system flexibility for upgrade and scaling.

Figure 4:
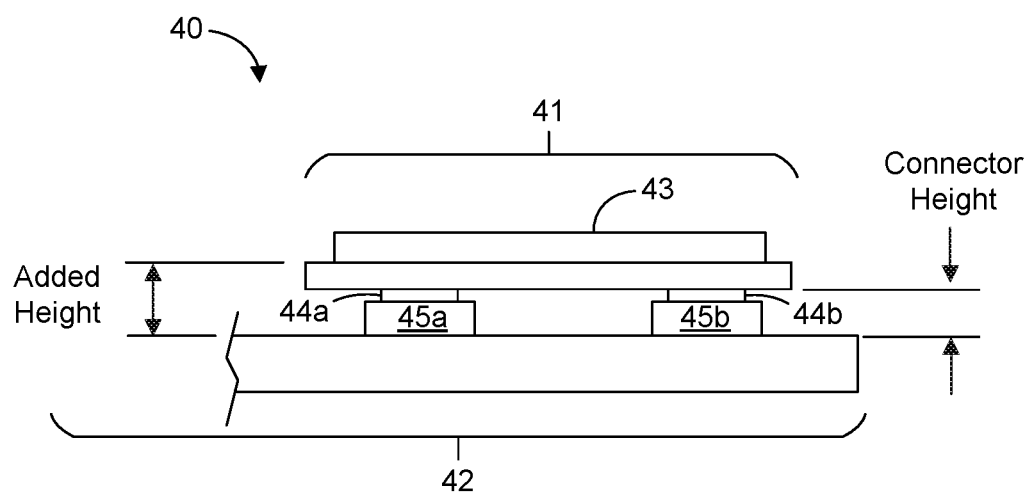
FIG. 4 is a front view block diagram of another example of an electronic system according to an embodiment.

With reference to FIG. 4, an embodiment of an electronic system 40 includes a LP5 memory module 41 plugged into a main assembly 42. The LP5 memory module includes two X32 LP5 components 43 soldered on the top side of the module 41, and two board-to-board plug connectors 44*a* and 44*b* soldered on the bottom side of the module 41. Discrete components (not shown), such as capacitors, can also be placed at the bottom side of the module 41. Two mating board-to-board receptacle connectors 45*a* and 45*b* are soldered on the top side of the main assembly 42. Advantageously, the arrangement of the board-to-board connectors on the bottom side of LP5 memory module 41 and the top side of the main assembly 42 only adds a small amount of height to the system 40 (e.g., about 2-3 mm in some embodiments).

Figure 5:
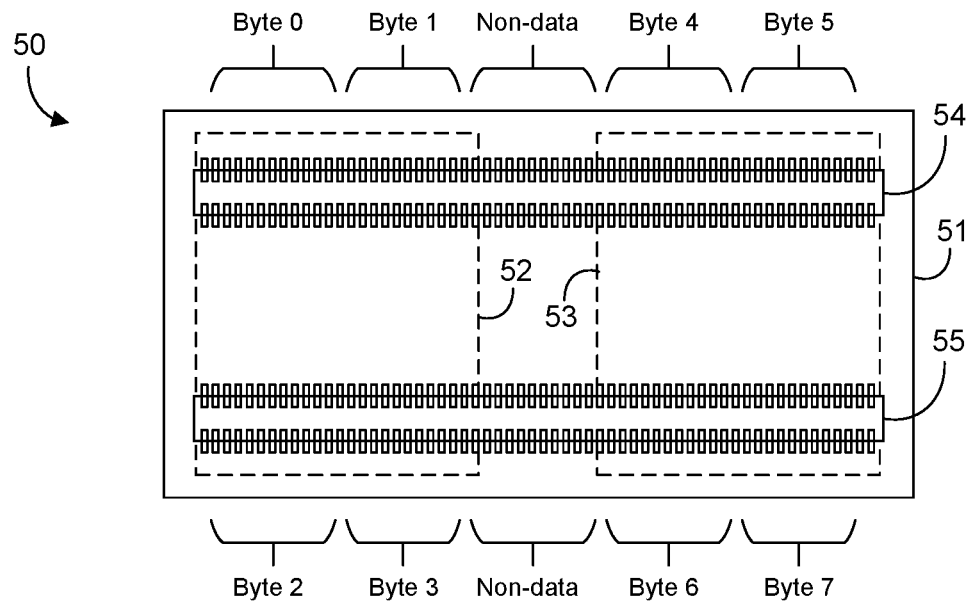
FIG. 5 is a bottom view block diagram of an example of a memory module according to an embodiment.

With reference to FIG. 5, and embodiment of a memory module 50 includes a circuit board 51, a first memory device 52 soldered on a top side of the circuit board 51, a second memory device 53 soldered on the top side of the circuit board 51, and a first board-to-board plug connector 54 soldered on a bottom side of the circuit board 51 and placed side-by-side with a second board-to-board plug connector 55 soldered on the bottom side of the circuit board 51. The first memory device 52 has four lower order data bytes of a quadword (Byte 0 through Byte 3), and the second memory device 53 has four upper order data bytes of the quadword (Byte 4 through Byte 7). The pinout of the connectors 54 and 55 is configured to match the bailout of the memory devices 52 and 53 and keep the routing length within about 3 mm (e.g., 0.1 inch) for good performance. For example, the lower order data bytes are all coupled to pins at one end of the connectors 54 and 55 while the upper order data bytes are all coupled to pins at the other end of the connectors 54 and 55. The pins in the central region of the connectors 54 and 55 may be preferentially utilized for non-data signals from the memory devices 52 and 53.

Figure 6:
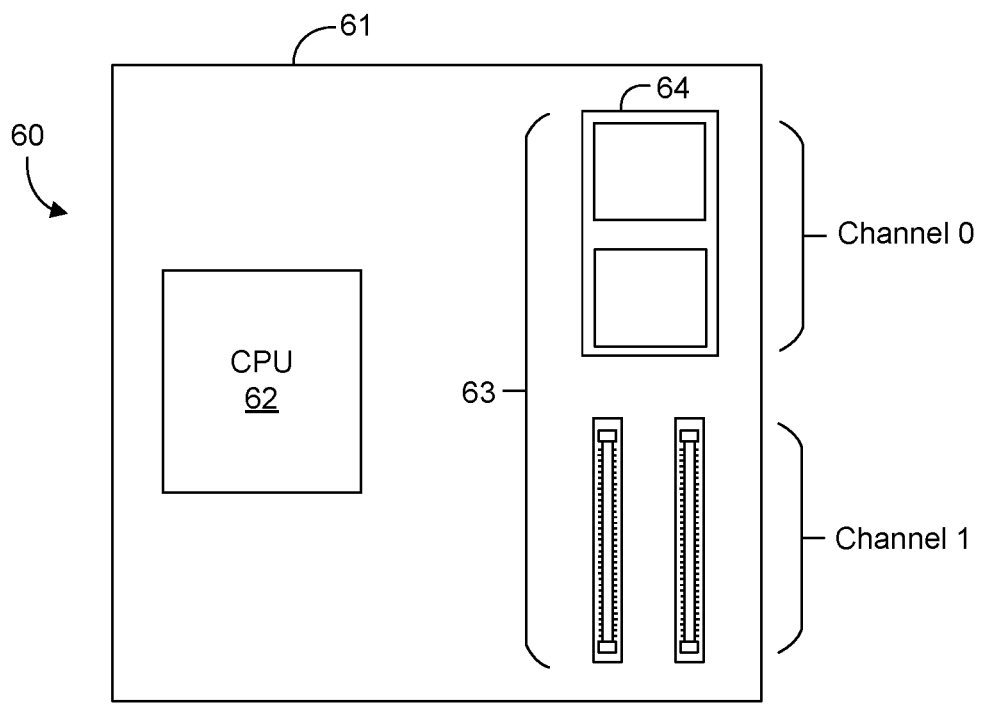
FIG. 6 is a top view block diagram of another example of an electronic system according to an embodiment.

With reference to FIG. 6, an embodiment of an electronic system 60 includes a main assembly 61 with a central processor unit 62 (e.g., and other components; not shown) and two sets of board-to-board receptacle connectors 63 to receive up to two adjacent memory modules for two memory channels (e.g., Channel 0 and Channel 1). As illustrated, one memory module 64 is plugged into the main assembly 61 for Channel 0.

The embodiments described herein illustrate only non-limiting examples of main boards, memory boards, connectors, modules, subassemblies, etc. Given the benefit of the present specification and drawings, numerous other examples will occur to those skilled in the art.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Additional Notes and Examples

Example 1 includes an electronic apparatus, comprising a circuit board, one or more memory devices affixed to a top side of the circuit board, and one or more board-to-board connectors affixed to a bottom side of the circuit board to provide an external connection to signals of the one or more memory devices, wherein the one or more board-to-board connectors are located inward from outermost edges of the circuit board and wherein a first footprint defined by an outermost boundary of the one or more board-to-board connectors is substantially a same size as or smaller than a second footprint defined by an outermost boundary of the one or more memory devices.

Example 2 includes the apparatus of Example 1, wherein the one or more board-to-board connectors comprise a first board-to-board connector located proximate to a first edge of the circuit board, and a second board-to-board connector located proximate to a second edge of the circuit board opposite to the first edge.

Example 3 includes the apparatus of Example 2, further comprising one or more electronic components affixed to the bottom side of the circuit board in between the first board-to-board connector and the second board-to-board connector.

Example 4 includes the apparatus of Example 3, wherein the one or more electronic components comprise discrete components.

Example 5 includes the apparatus of any of Examples 1 to 4, wherein signal pads of the one or memory devices are electronically coupled to pin pads of the one or more board-to-board connectors to provide closer proximity of signal pads and pin pads for data signals of the one or more memory devices relative to non-data signals of the one or more memory devices.

Example 6 includes the apparatus of Example 5, wherein respective routing lengths between signals pads of the one or memory devices and pin pads of the one or more board-to-board connectors for a majority of the data signals are less than 3 millimeters.

Example 7 includes the apparatus of any of Examples 5 to 6, wherein signal pads for the data signals of the one or more memory devices are substantially all coupled to pin pads of the one or more board-to-board connectors that are located within respective areas of the circuit board defined by an outermost boundary of the signal pads of each of the one or more memory devices.

Example 8 includes the apparatus of any of Examples 5 to 7, wherein signal pads for lower order bits of the data signals of the one or more memory devices are coupled to pin pads at a first end of the one or more board-to-board connectors and signal pads for upper order bits of the data signals of the one or more memory devices are coupled to pin pads at a second end of the one or more board-to-board connectors opposite to the first end.

Example 9 includes the apparatus of any of Examples 1 to 8, wherein the one or more board-to-board connectors comprise plug-style connectors to mate with receptacle-style connectors on another circuit board.

Example 10 includes the apparatus of any of Examples 1 to 9, wherein the one or more memory devices comprise low power memory devices.

Example 11 includes an electronic system, comprising a main board with one or more electronic components affixed thereto and a first set of one or more board-to-board connectors affixed thereto, and a memory board with one or more memory devices affixed to a top side of the memory board and a second set of one or more board-to-board connectors affixed to a bottom side of the memory board and located inward from outermost edges of the memory board, wherein the second set of one or more board-to-board connectors is mechanically and electrically coupled to the first set of one or more board-to-board connectors on the main board, and wherein a first footprint defined by an outermost boundary of the second set of one or more board-to-board connectors is substantially a same size as or smaller than a second footprint defined by an outermost boundary of the one or more memory devices.

Example 12 includes the system of Example 11, wherein the second set of one or more board-to-board connectors comprises a first board-to-board connector located proximate to a first edge of the memory board, and a second board-to-board connector located proximate to a second edge of the memory board opposite to the first edge.

Example 13 includes the system of Example 12, further comprising one or more electronic components affixed to the bottom side of the memory board in between the first board-to-board connector and the second board-to-board connector.

Example 14 includes the system of Example 13, wherein the one or more electronic components comprise discrete components.

Example 15 includes the system of any of Examples 11 to 14, wherein signal pads of the one or memory devices are electronically coupled to pin pads of the second set of one or more board-to-board connectors to provide closer proximity of signal pads and pin pads for data signals of the one or more memory devices relative to non-data signals of the one or more memory devices.

Example 16 includes the system of Example 15, wherein respective routing lengths between signals pads of the one or memory devices and pin pads of the second set of one or more board-to-board connectors for a majority of the data signals are less than 3 millimeters.

Example 17 includes the system of any of Examples 15 to 16, wherein signal pads for the data signals of the one or more memory devices are substantially all coupled to pin pads of the second set of one or more board-to-board connectors that are located within respective areas of the memory board defined by an outermost boundary of the signal pads of each of the one or more memory devices.

Example 18 includes the system of any of Examples 15 to 17, wherein signal pads for lower order bits of the data signals of the one or more memory devices are coupled to pin pads at a first end of the second set of one or more board-to-board connectors and signal pads for upper order bits of the data signals of the one or more memory devices are coupled to pin pads at a second end of the second set of one or more board-to-board connectors opposite to the first end.

Example 19 includes the system of any of Examples 11 to 18, wherein the first set of one or more board-to-board connectors comprise receptacle-style connectors and the second set of one or more board-to-board connectors comprise plug-style connectors.

Example 20 includes the system of any of Examples 11 to 19, further comprising one or more additional sets of one or more board-to-board connectors affixed to the main board to couple to additional memory boards.

Example 21 includes a method, comprising affixing one or more memory devices to a top side of a circuit board, and affixing one or more board-to-board connectors to a bottom side of the circuit board to provide an external connection to signals of the one or more memory devices, wherein the one or more board-to-board connectors are located inward from outermost edges of the circuit board and wherein a first footprint defined by an outermost boundary of the one or more board-to-board connectors is substantially a same size as or smaller than a second footprint defined by an outermost boundary of the one or more memory devices.

Example 22 includes the method of Example 21, further comprising affixing a first one of the one or more board-to-board connectors proximate to a first edge of the circuit board, and affixing a second board-to-board connector proximate to a second edge of the circuit board opposite to the first edge.

Example 23 includes the method of Example 22, further comprising affixing one or more electronic components to the bottom side of the circuit board in between the first board-to-board connector and the second board-to-board connector.

Example 24 includes the method of Example 23, wherein the one or more electronic components comprise discrete components.

Example 25 includes the method of any of Examples 21 to 24, further comprising electronically coupling signal pads of the one or memory devices to pin pads of the one or more board-to-board connectors to provide closer proximity of signal pads and pin pads for data signals of the one or more memory devices relative to non-data signals of the one or more memory devices.

Example 26 includes the method of Example 25, wherein respective routing lengths between signals pads of the one or memory devices and pin pads of the one or more board-to-board connectors for a majority of the data signals are less than 3 millimeters.

Example 27 includes the method of any of Examples 25 to 26, further comprising coupling substantially all signal pads for the data signals of the one or more memory devices to pin pads of the one or more board-to-board connectors that are located within respective areas of the circuit board defined by an outermost boundary of the signal pads of each of the one or more memory devices.

Example 28 includes the method of any of Examples 25 to 27, further comprising coupling signal pads for lower order bits of the data signals of the one or more memory devices to pin pads at a first end of the one or more board-to-board connectors, and coupling signal pads for upper order bits of the data signals of the one or more memory devices to pin pads at a second end of the one or more board-to-board connectors opposite to the first end.

Example 29 includes the method of any of Examples 21 to 28, wherein the one or more board-to-board connectors comprise plug-style connectors to mate with receptacle-style connectors on another circuit board.

Example 30 includes the method of any of Examples 21 to 29, wherein the one or more memory devices comprise low power memory devices.

Example 31 includes an apparatus, comprising means for affixing one or more memory devices to a top side of a circuit board, and means for affixing one or more board-to-board connectors to a bottom side of the circuit board to provide an external connection to signals of the one or more memory devices, wherein the one or more board-to-board connectors are located inward from outermost edges of the circuit board and wherein a first footprint defined by an outermost boundary of the one or more board-to-board connectors is substantially a same size as or smaller than a second footprint defined by an outermost boundary of the one or more memory devices.

Example 32 includes the apparatus of Example 31, further comprising means for affixing a first one of the one or more board-to-board connectors proximate to a first edge of the circuit board, and means for affixing a second board-to-board connector proximate to a second edge of the circuit board opposite to the first edge.

Example 33 includes the apparatus of Example 32, further comprising means for affixing one or more electronic components to the bottom side of the circuit board in between the first board-to-board connector and the second board-to-board connector.

Example 34 includes the apparatus of Example 33, wherein the one or more electronic components comprise discrete components.

Example 35 includes the apparatus of any of Examples 31 to 34, further comprising means for electronically coupling signal pads of the one or memory devices to pin pads of the one or more board-to-board connectors to provide closer proximity of signal pads and pin pads for data signals of the one or more memory devices relative to non-data signals of the one or more memory devices.

Example 36 includes the apparatus of Example 35, wherein respective routing lengths between signals pads of the one or memory devices and pin pads of the one or more board-to-board connectors for a majority of the data signals are less than 3 millimeters.

Example 37 includes the apparatus of any of Examples 35 to 36, further comprising means for coupling substantially all signal pads for the data signals of the one or more memory devices to pin pads of the one or more board-to-board connectors that are located within respective areas of the circuit board defined by an outermost boundary of the signal pads of each of the one or more memory devices.

Example 38 includes the apparatus of any of Examples 35 to 37, further comprising means for coupling signal pads for lower order bits of the data signals of the one or more memory devices to pin pads at a first end of the one or more board-to-board connectors, and means for coupling signal pads for upper order bits of the data signals of the one or more memory devices to pin pads at a second end of the one or more board-to-board connectors opposite to the first end.

Example 39 includes the apparatus of any of Examples 31 to 38, wherein the one or more board-to-board connectors comprise plug-style connectors to mate with receptacle-style connectors on another circuit board.

Example 40 includes the apparatus of any of Examples 31 to 39, wherein the one or more memory devices comprise low power memory devices.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as brackets, alignment pins and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An electronic apparatus, comprising:
   a circuit board;
   multiple dies each affixed to a top side of the circuit board, the multiple dies comprising a first die which comprises a first memory device, and a second die which comprises a second memory device; and
   multiple board-to-board connectors each affixed to a bottom side of the circuit board, the multiple board-to-board connectors each to provide respective external connections each to a different respective one of the first memory device or the second memory device via the circuit board, wherein:
   the multiple board-to-board connectors are located inward from outermost edges of the circuit board;
   a first footprint defined by an outermost boundary of the multiple board-to-board connectors is a same size as or smaller than a second footprint defined by an outermost boundary of the multiple dies; and
   the multiple board-to-board connectors comprise a first board-to-board connector and a second board-to-board connector which each extend under the first die, under the second die, and under a region which is between the first die and the second die.

2. The electronic apparatus of claim 1, wherein the first memory device and the second memory device are coupled to communicate, via the first board-to-board connector, different respective bytes of a multi-byte data value.

3. The electronic apparatus of claim 2, wherein, for each of the first memory device and the second memory device, the memory device is coupled to communicate respective bytes of the multi-byte data value each via a different respective one of the first board-to-board connector or the second board-to-board connector.

4. The electronic apparatus of claim 3, wherein:
   the multi-byte data value is to comprise a first byte, a second byte, a third byte and a fourth byte;
   the first byte is a less significant byte of the multi-byte data value, relative to the second byte;
   the third byte is a less significant byte of the multi-byte data value, relative to the fourth byte;
   the first board-to-board connector comprises:
      first pin pads at a first end of the first board-to-board connector; and
      second pin pads at a second end of the first board-to-board connector;
   the second board-to-board connector comprises:
      third pin pads at a third end of the second board-to-board connector; and
      fourth pin pads at a fourth end of the second board-to-board connector;
   the first end and the third end are each under the first memory device;
   the second end and the fourth end are each under the second memory device;
   the first memory device is to communicate:
      the first byte via the first pin pads; and
      the second byte via the second pin pads; and
   the second memory device is to communicate:
      the third byte via the third pin pads; and
      the fourth byte via the fourth pin pads.

5. The electronic apparatus of claim 1, wherein:
   the multiple dies are coupled to communicate a multi-byte data value via pin pads of the multiple board-to-board connectors which are each under a respective one of the first die or the second die; and
   the multiple dies are coupled further to communicate non-data signals each via a respective pin pad of the multiple board-to-board connectors which is under a region between the first memory device and the second memory device.

6. The electronic apparatus of claim 5, wherein:
   each bit of the multi-byte data value is to be communicated via a respective one of interconnects which each extend to a different respective signal pad of the multiple dies, and to a different respective pin pad of the multiple board-to-board connectors; and respective routing lengths of the interconnects are each less than 3 millimeters.

7. The electronic apparatus of claim 5, wherein:

the first die is to communicate first bytes of the multi-byte data value each via a different respective one of the first board-to-board connector or the second board-to-board connector; and the second die is to communicate second bytes of the multi-byte data value each via a different respective one of the first board-to-board connector or the second board-to-board connector.

8. The electronic apparatus of claim 1, wherein the multiple board-to-board connectors comprise plug-style connectors to mate with receptacle-style connectors on another circuit board.

9. The electronic apparatus of claim 1, further comprising:

electronic components each affixed to the bottom side of the circuit board in between the first board-to-board connector and the second board-to-board connector.

10. An electronic system, comprising:

a main board;

one or more electronic components affixed to the main board;

a first set of board-to-board connectors affixed to the main board;

a memory board;

memory dies affixed to a top side of the memory board, the memory dies comprising a first memory die and a second memory die; and a second set of board-to-board connectors affixed to a bottom side of the memory board and located inward from outermost edges of the memory board;

wherein:

the second set of board-to-board connectors is mechanically and electrically coupled to the main board via the first set of board-to-board connectors;

a first footprint defined by an outermost boundary of the second set of board-to-board connectors is a same size as or smaller than a second footprint defined by an outermost boundary of the memory dies; and the second set of board-to-board connectors comprise a first board-to-board connector and a second board-to-board connector which each extend under the first memory die, under the second memory die, and under a region which is between the first memory die and the second memory die.

11. The electronic system of claim 10, wherein the first memory die and the second memory die are coupled to communicate, via the first board-to-board connector, different respective bytes of a multi-byte data value.

12. The electronic system of claim 11, wherein, for each of the first memory die and the second memory die, the memory die is coupled to communicate respective bytes of the multi-byte data value each via a different respective one of the first board-to-board connector or the second board-to-board connector.

13. The electronic system of claim 12, wherein:

the multi-byte data value is to comprise a first byte, a second byte, a third byte and a fourth byte;

the first byte is a less significant byte of the multi-byte data value, relative to the second byte;

the third byte is a less significant byte of the multi-byte data value, relative to the fourth byte;

the first board-to-board connector comprises:

first pin pads at a first end of the first board-to-board connector; and second pin pads at a second end of the first board-to-board connector;

the second board-to-board connector comprises:

third pin pads at a third end of the second board-to-board connector; and fourth pin pads at a fourth end of the second board-to-board connector;

the first end and the third end are each under the first memory die;

the second end and the fourth end are each under the second memory die;

the first memory die is to communicate:

the first byte via the first pin pads; and the second byte via the second pin pads; and the second memory die is to communicate:

the third byte via the third pin pads; and the fourth byte via the fourth pin pads.

14. The electronic system of claim 10, wherein:

the memory dies are coupled to communicate a multi-byte data value via pin pads of the second set of board-to-board connector which are each under a respective one of the first die or the second die; and the memory dies are coupled further to communicate non-data signals each via a respective pin pad of the second set of board-to-board connectors which is under a region between the first memory die and the second memory die.

15. The electronic system of claim 14, wherein:

each bit of the multi-byte data value is to be communicated via a respective one of interconnects which each extend to a different respective signal pad of the memory dies, and to a different respective pin pad of the second set of board-to-board connectors; and respective routing lengths of the interconnects are each less than 3 millimeters.

16. The electronic system of claim 14, wherein:

the first memory die is to communicate first bytes of the multi-byte data value each via a different respective one of the first board-to-board connector or the second board-to-board connector; and the second memory die is to communicate second bytes of the multi-byte data value each via a different respective one of the first board-to-board connector or the second board-to-board connector.

17. The electronic system of claim 10, wherein the first set of board-to-board connectors comprise receptacle-style connectors and the second set of board-to-board connectors comprise plug-style connectors.

18. The electronic system of claim 10, further comprising:

one or more additional sets of one or more board-to-board connectors affixed to the main board to couple to additional memory boards.

* * * * *